United States Patent
Laptev et al.

(10) Patent No.: US 7,179,350 B2
(45) Date of Patent: Feb. 20, 2007

(54) REACTIVE SPUTTERING OF SILICON NITRIDE FILMS BY RF SUPPORTED DC MAGNETRON

(75) Inventors: Pavel N. Laptev, Santa Barbara, CA (US); Valery V. Felmetsger, Ventura, CA (US)

(73) Assignee: Tegal Corporation, Petaluma, CA (US)

( * ) Notice: Subject to any disclaimer, the term of this patent is extended or adjusted under 35 U.S.C. 154(b) by 637 days.

(21) Appl. No.: 10/446,005

(22) Filed: May 23, 2003

(65) Prior Publication Data

US 2004/0231972 A1 Nov. 25, 2004

(51) Int. Cl.
*C23C 14/34* (2006.01)

(52) U.S. Cl. ............... 204/192.12; 204/298.06; 204/298.08; 204/298.18; 204/298.19

(58) Field of Classification Search ........... 204/192.12, 204/298.06, 298.08, 298.17, 298.18, 298.19
See application file for complete search history.

(56) References Cited

U.S. PATENT DOCUMENTS

| | | | | |
|---|---|---|---|---|
| 4,661,228 A | * | 4/1987 | Mintz | 204/192.25 |
| 5,415,757 A | * | 5/1995 | Szcyrbowski et al. | 204/298.08 |
| 6,420,863 B1 | * | 7/2002 | Milde et al. | 324/76.76 |
| 6,824,653 B2 | * | 11/2004 | Oshmyansky et al. | 204/192.12 |

FOREIGN PATENT DOCUMENTS

| | | |
|---|---|---|
| DE | 41 27 262 C1 | 6/1992 |
| EP | 0 334 564 A | 9/1989 |
| EP | 1 046 727 A | 10/2000 |
| WO | WO 01/29278 A | 4/2001 |

* cited by examiner

*Primary Examiner*—Rodney G. McDonald
(74) *Attorney, Agent, or Firm*—Fliesler Meyer LLP

(57) ABSTRACT

An asymmetric alternating voltage (preferably 40 KHz) is provided between a pair of targets having a coaxial (preferably frusto-conical) relationship to (1) deposit the material in a uniform thickness on the substrate surface (2) eliminate dielectric material from the surfaces of the targets and other components (3) provide a single ignition of the targets and eliminate target ignitions thereafter and (4) reduce the substrate temperature by using low energy ("cold") electrons from a plasma discharge to produce a low energy current. The asymmetry may result from amplitude differences between the voltage in alternate half cycles and the voltage in the other half cycles. A second alternating voltage (preferably radio frequency) modulates the asymmetric alternating voltage to provide the smooth plasma ignition. The different voltage amplitudes applied to each of the targets are also instrumental in providing for a substantially constant deposition thickness at the different positions on the surface of the substrate.

57 Claims, 5 Drawing Sheets

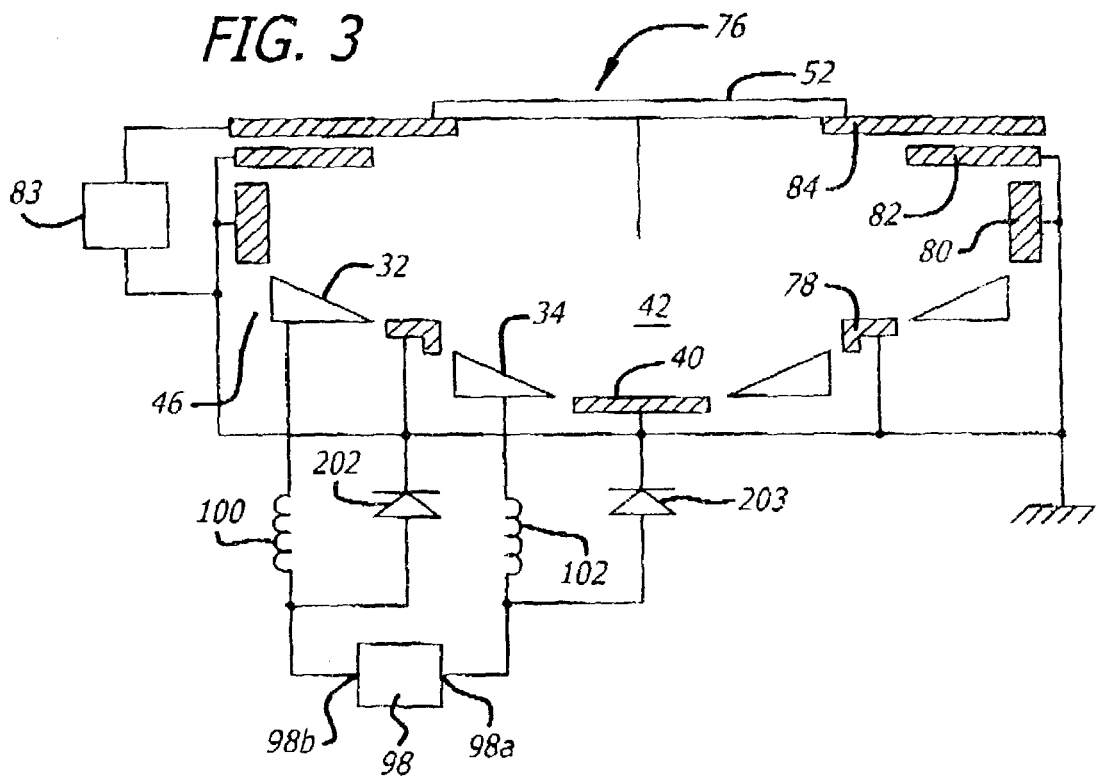
FIG. 3
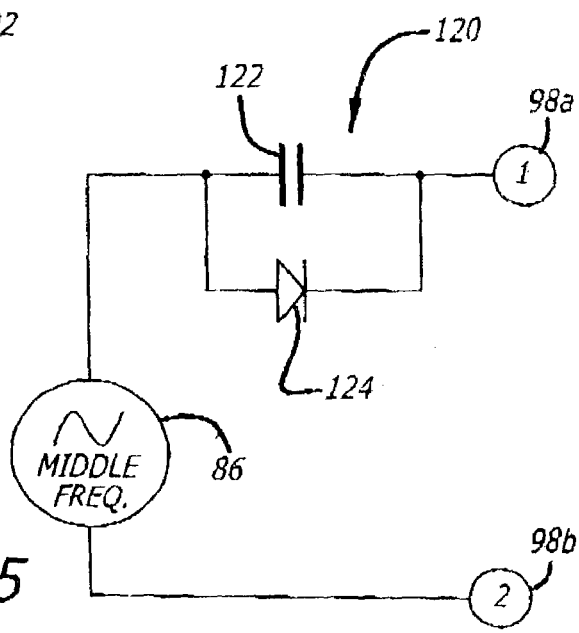
FIG. 4
FIG. 5

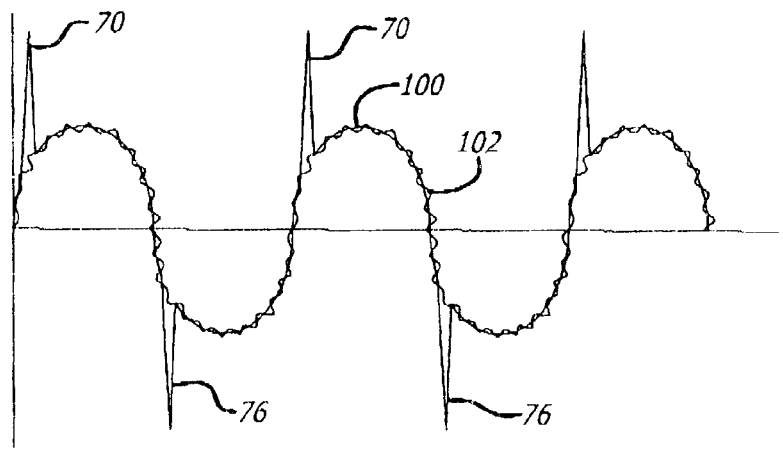
FIG. 11
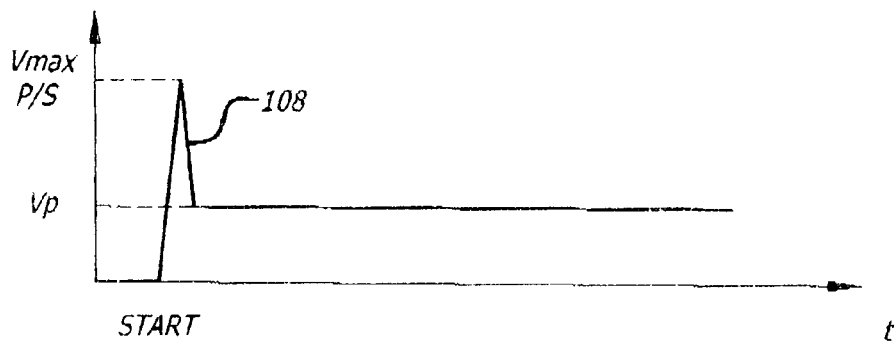
FIG. 12
FIG. 13
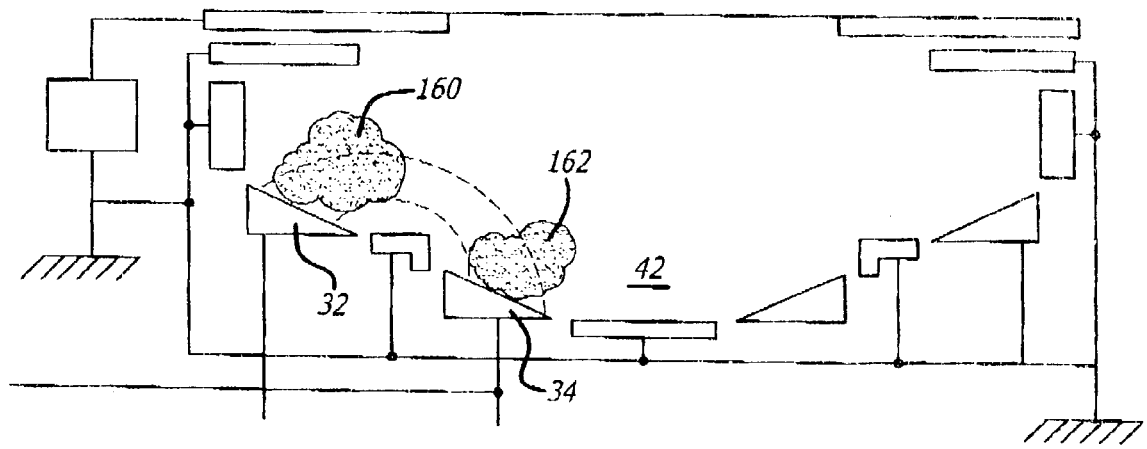

REACTIVE SPUTTERING OF SILICON NITRIDE FILMS BY RF SUPPORTED DC MAGNETRON

This application is a non-provisional application corresponding to a provisional application filed in the United States Patent and Trademark Office on or about Dec. 12, 2002 and entitled REACTIVE SPUTTERING OF SILICONE NITRIDE FILMS BY RF SUPPORTED DEC MAGNETRON and listing Pavel N. Laptev and Valery V. Felmetsger as joint inventors.

This invention relates to a system for, and method of, producing a deposition of material on a substrate. More particularly, the invention relates to a system for, and method of, producing on a substrate a deposition that provides a uniform coating.

BACKGROUND OF THE INVENTION

Integrated circuit chips are being used now in all kinds of apparatus to provide complex electrical circuitry for controlling different operations or for providing data and mathematical calculations in business, education, science and many other fields. With progressive advances in time, the size of the integrated circuit chips has progressively decreased. Even as the chips have decreased in size, the circuitry on the chips has become progressively complex.

The fabrication of each layer on an integrated circuit is provided by disposing a target, or targets, and the substrate in apparatus which includes an anode. The target(s) and the anode define a cavity. The electrical potentials on the target(s) and the anode cause an electrical field to be produced between the anode and the target(s) in a first direction in the cavity. A magnetic field is also produced in the cavity in a second direction transverse, and preferably substantially perpendicular, to the first direction.

The combination of the electrical and magnetic fields causes electrons in the cavity to move in a spiral path. These electrons ionize molecules of an inert gas (e.g. argon) which flow through the cavity. The ions are attracted to the target(s) and cause atoms to be emitted from the target(s). The atoms become deposited on the substrate to form a layer on the substrate. The layer may be an electrically conductive material or it may be a dielectric (or electrically insulating) material.

When the layer is formed from an electrically conductive material, the material is etched to form electrical leads. The integrated circuit chips are formed from a plurality of successive layers, some of which are electrically conductive and others of which are electrically insulating. Electrical pegs or vias are provided between the different electrically conductive layers. The electrical pegs or vias are disposed in sockets provided in insulating layers in the chips. The integrated chips are formed in wafers, each of which holds a plurality, sometimes hundreds and often even thousands, of integrated circuit chips.

The fabrication of the different layers in an integrated circuit has to be precise. For example, the thickness and width of the circuit leads in the different layers have to be precise in order to maintain the proper impedance values for different components in the circuits. If the proper impedance values are not maintained, the operation of the electrical circuitry in the integrated circuit chip is impaired. Sometimes two targets are disposed in the cavity. The targets are preferably made from the same materials but they may be made from different materials. The targets may be disposed in a co-axial (preferably frusto-conical) relationship. Material from each of the targets is deposited on the substrate to form a layer. The layer has different thicknesses at different positions on the substrate because each of the targets provides a different contribution to the substrate layer than the other target.

Gases existing in the cavity may be oxygen ($O_2$), nitrogen ($N_2$) and methane ($CH_4$). These gases combine with atoms of the material forming the target(s) and produce compounds which settle on the targets and other members forming the deposition apparatus. For example, aluminum (Al) may combine with oxygen ($O_2$) to form aluminum oxide ($Al_2O_3$); silicon (Si) may combine with nitrogen ($N_2$) to form silicon nitride ($Si_3O_4$); silicon (Si) may combine with methane to form silicon carbide (SiC); and tantalum (Ta) may combine with oxygen ($O_2$) and nitrogen (N2) to form (TaOxNy).

All of these resultant materials constitute solid dielectrics. When deposited on a member receiving a voltage, they prevent the member from receiving the benefit of the received voltage. For example, when one of these dielectric compounds is deposited on a target, it prevents an electrical field from being produced between the anode and the target, thereby preventing atoms of the material on the target from being emitted from the target.

When two (2) targets are disposed in the cavity, they receive an alternating voltage which causes one of the targets to be activated in alternate half cycles and the other one of the targets to be activated in the other half cycles. In this way, each target plays the role of an anode while the other target is activated. When activated, each target deposits atoms of the target material on the substrate and removes a thin dielectric material grown on its surface during the previous half cycle. Thus a self-cleaning process occurs. Every time that one of the targets is activated, it produces a voltage spike. This voltage spike prevents a smooth and uniform deposition of the target material from being provided on the substrate. A smooth and uniform deposition is desirable because it enhances the operation of the electrical circuitry formed on the substrate. Moreover, the spike creates particles and defects in the film deposited on the substrate.

BRIEF DESCRIPTION OF PREFERRED EMBODIMENTS OF THE INVENTION

A system applies an asymmetric alternating voltage (preferably 40 KHz) modulated by RF (e.g. 13.56 MHz) power between a pair of targets having a coaxial relationship and uses an additional diode circuit in order to:

1. Eliminate dielectric material from the surfaces of the targets during the deposition process and eliminate arcing previously resulting from the deposition of this dielectric material on the target surfaces;

2. Provide a uniform coating by adjusting the level of asymmetry (applying different levels of power to the individual ones of the targets);

3. Provide a smooth ignition of the targets due to permanent ionization of the target vicinity resulting from RF discharge.

4. Reduce defects and foreign particles in the deposited film by eliminating any voltage spike during the target ignition.

5. Reduce the temperature of the substrate by preventing low energy ("cold") electrons from the plasma discharge from reaching the substrate;

6. Provide a substantially uniform deposition rate at the different positions on the surface of the substrate;

7. Reduce intrinsic stress in the deposited film by reducing the bombardment of the substrate by charged particles.

BRIEF DESCRIPTION OF THE DRAWINGS

In the drawings:

FIG. 3 is an electrical circuit diagram showing another preferred embodiment of a system constituting the invention;

FIG. 4 is an electrical circuit diagram, partially in block form, showing an asymmetric power generator for generating an asymmetric alternating voltage for use in the embodiments of the invention shown in FIGS. 2 and 3;

FIG. 5 is an electrical circuit diagram of a preferred embodiment of the asymmetric power generator shown in block form in FIG. 4;

FIG. 11 schematically shows how the voltage applied to an individual one of the targets in each half cycle of the alternating voltage in the prior art becomes triggered to produce a voltage spike;

FIG. 12 schematically shows how the production of the voltage spikes in each half cycle of the alternating voltage is eliminated by using the circuitry shown in FIGS. 2–7; and FIG. 13 shows how the production of plasma is utilized in the embodiments shown in FIGS. 2–7 to clean the targets of any undesirable layer of foreign material.

DETAILED DESCRIPTION OF A PREFERRED EMBODIMENT OF THE INVENTION

Figure 1:
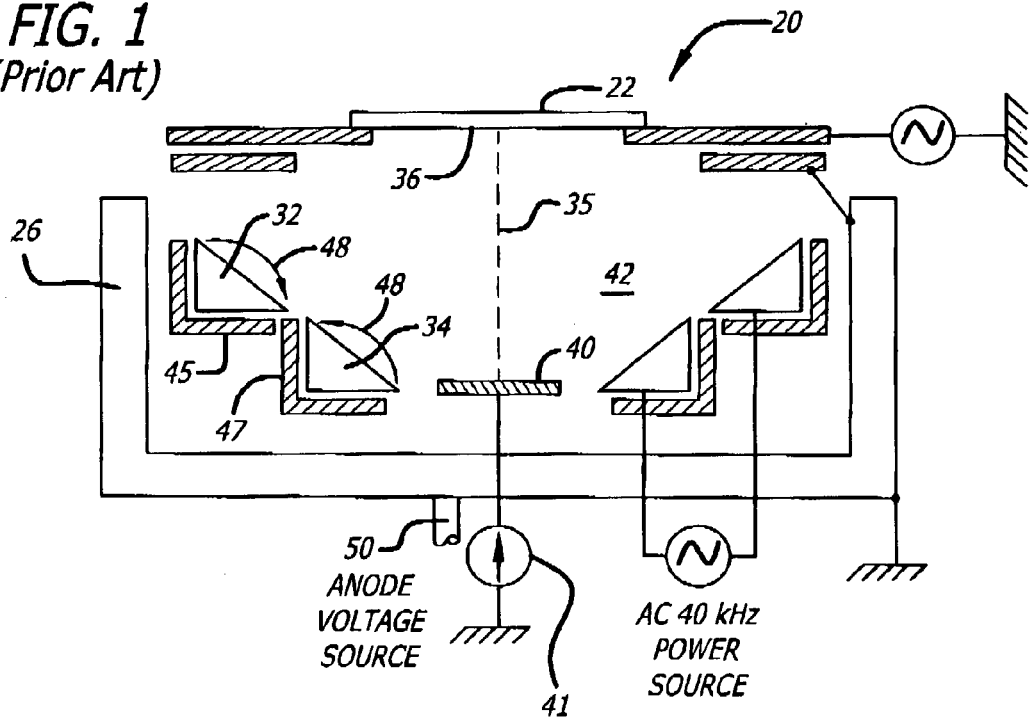
FIG. 1 is a schematic view of prior art apparatus for producing a deposition of material from targets on a substrate.

FIG. 1 illustrates on a simplified schematic basis a portion of a prior art embodiment of apparatus, generally indicated at 20, for producing a deposition on a substrate 22. The apparatus 10 may include a pair of targets 32 and 34 which may be spaced from a grounded shield 26. Each of the targets 32 and 34 may be provided with a suitable configuration such as a hollow frusto-conical configuration. The targets 32 and 34 may be coaxial on a common axis 35 and the target 32 is displaced from the target 34 in the axial direction and is provided with a greater radius than the target 34. The targets 32 and 34 may be made from a material which is to be deposited in a layer on a surface 36 of the substrate 22. For example, the targets 32 and 34 may be made from copper when a layer of copper is to be deposited on the substrate 38. However, the target 32 may be made from a material different from the material of the target 34.

An anode 40 is disposed in a spaced, preferably coaxial, relationship to the targets 32 and 34. A positive bias is applied by a source 41 to the anode 40 to produce an electrical field between the anode 40 and the targets 32 and 34. Applying a positive bias to the anode 40 changes the plasma properties and may be used to provide an additional control over the properties of the film deposited on the surface 36 of the substrate 22. The anode 40 is closer to the target 34 than to the target 32. The anode 40 and the targets 32 and 34 define a cavity 42. The electrical field between the anode 40 and the targets 32 and 34 causes electrons to be produced in the cavity 42. Magnets 45 and 47 may be respectively disposed relative to the anodes 32 and 34 to produce a magnetic field 48 parallel to the target surfaces. The magnetic field 48 is disposed in a direction transverse, preferably substantially perpendicular, to the direction of the electrical field.

Molecules of an inert gas such as argon are introduced as at 50 into the cavity 42. These molecules are ionized by electrons in the cavity 42 and produce positive ions. The ionization of the argon molecules in the cavity 42 is facilitated because the electrons travel in the cavity 42 in a spiral path as a result of the transverse, preferably substantially perpendicular, relationship between the magnetic and electrical fields. The positive ions of argon travel to the targets 32 and 34 and cause atoms to be sputtered from the inclined surfaces of the targets. These atoms move to the exposed surface 36 of the substrate 22 and become deposited on the exposed surface.

Due to the bipolar nature of the AC voltage, each of the targets 32 and 34 operates as an anode when a positive half cycle of voltage is applied to the target while the other target operates as a cathode and vice versa in the negative half cycle of the alternating voltage. Important advantages are achieved when a dual magnetron arrangement is employed. In a bipolar mode, the two targets act alternatively as an anode and a cathode of the discharge and no separate anode is needed. However, the area of the dual cathode magnetron application is limited due to the substrate becoming overheated during film deposition and due to possible irradiation damage of the electronic devices disposed on the depositing substrate 22.

Due to the "pulsed" nature of the discharge at the middle frequency (e.g. 40 KHz), the plasma has to be ignited every half period of the electrical signal. Frequent plasma ignitions (80000 times per second for 40 KHz discharge) create non-equilibrium conditions in the magnetron because the plasma cannot be effectively confined in the target vicinity and thus extends also to the substrate direction. An excessive substrate bombardment by the charged particles leads to structural defects in the formation of the growing film and to device damage. Moreover, when one of the targets has a negative potential and emits electrons as a cathode of the discharge, the second target is at a positive potential and collects electrons. But the positive target cannot be an effective collector of electrons because the high magnetic field deflects electrons from the target surface. As a result, during the deposition process, a significant amount of electrons may reach the surface 36 of the substrate 22, thereby developing a high temperature on the substrate.

Figure 10:
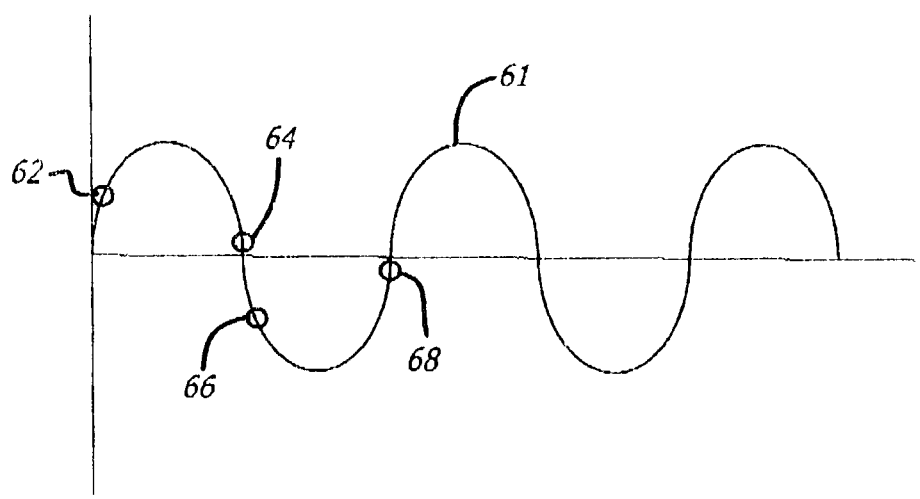
FIG. 10 is a curve schematically showing the times in successive half cycles of an alternating voltage when molecules of gas start to become ionized and when the ionization of the molecules of the gas is discontinued in that half cycle.

FIG. 10 indicates the operation of the system 20 in response to the application of the alternating voltage to the targets 32 and 34. In alternate half cycles, one of the targets 32 and 34 becomes triggered to the sputtering state as at 62 and becomes deactivated as at 64. In the other half cycles, the other one of the targets becomes triggered to the sputtering state as at 66 and becomes deactivated as at 68.

There are unresolved problems in the deposition apparatus 20 described above. One problem results from the fact that the amount of the material deposited on the exposed surface 36 of the substrate 22 from the target 34 is greater than the amount of the material deposited on the surface of the substrate from the target 32. This happens because AC power applied is symmetric so both targets receive an equal amount of power but their geometric sizes and locations are not equal. This results in a higher deposition rate at the center of the substrate 22 than at the periphery of the substrate.

Another unresolved problem results from the magnetic field on the surface of the target 34. In the half cycle of the power when the target 34 operates as an anode, it collects the electrons. But the magnetic field on the surface of the target 34 resists the electron flow to the target. Thus the efficiency of the target 34 is low when it acts as an anode. As a result, the "cold" electrons reach the surface 36 of the substrate 22 and develop heat and even destroy components on the surface of the substrate. The same problem exist in the other half cycle of the alternating voltage applied to the targets when the target 32 serves as an anode.

Figure 2:
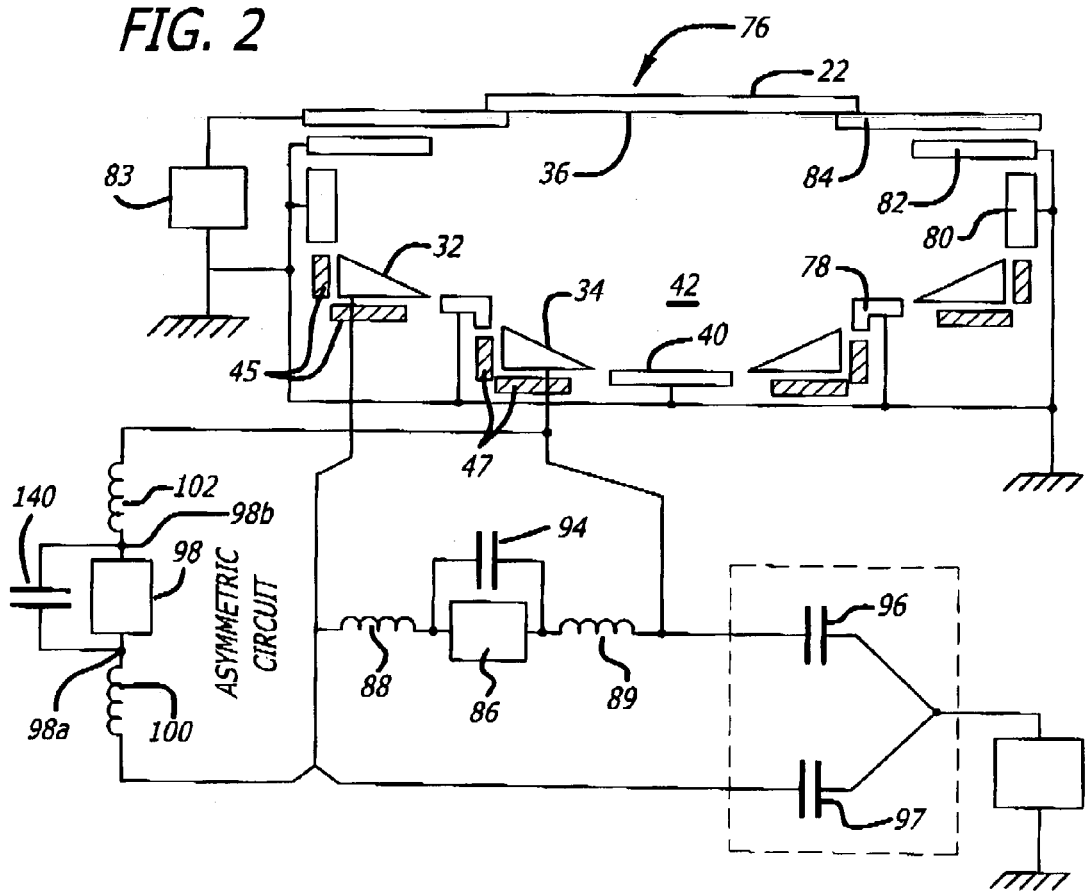
FIG. 2 is an electrical circuit diagram showing a preferred embodiment of a system constituting the invention.

The system and method disclosed and claimed in this application and generally indicated at 76 in FIGS. 2 and 3 resolve the problems discussed in the previous paragraphs. The system includes the targets 32 and 34 and the anode 40 shown in FIG. 1. However, an alternating voltage is applied between the targets 32 and 34 in a middle range of frequencies which may be preferably between approximately twenty kilohertz (20 KHz) and eighty kilohertz (80 KHz).

Figure 9:
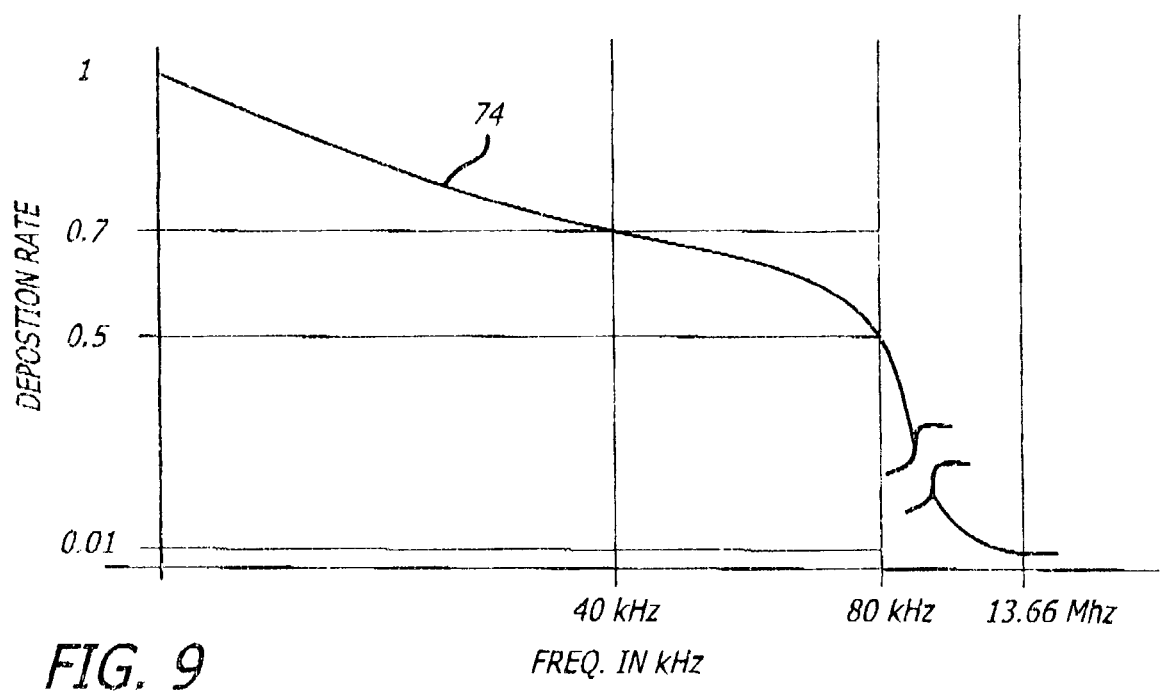
FIG. 9 is a curve showing the rate of deposition on a substrate for different frequencies applied in an intermediate range to the circuits shown in FIGS. 2–7.

FIG. 9 is a curve 74 which shows progressive frequencies along the horizontal axis and the rate of deposition of material from the targets 32 and 34 on the substrate 22 along the vertical axis. As will be seen in FIG. 9, the rate of deposition progressively decreases from a rate indicated as 1.0 at a zero frequency with progressive increases in frequency into the middle range of approximately twenty kilohertz (20 KHz) to approximately eighty kilohertz (80 KHz).

As will be seen in FIG. 9, the deposition rate is 1.0 for a DC voltage applied to the target 32 or the target 34. The deposition rate decreases to a value of approximately 0.7 when an alternating voltage is applied between the targets 32 and 34 at a frequency of approximately 40 kilohertz (40 KHz). The deposition rate decreases to a value of approximately 0.5 when an alternating voltage is applied between the targets 32 and 34 at a frequency of approximately 80 kilohertz (80 KHz).

FIG. 2 schematically shows a system, generally indicated at 76, constituting one of the preferred embodiments of the invention. The system includes the targets 32 and 34, the anode 40, the cavity 42 and the substrate 22. Magnets 45 and 47 may be included in the system corresponding to the magnets 45 and 47 in FIG. 1. Shields 78, 80 and 82 may be provided in the system and may be electrically connected to a suitable reference potential such as ground. The substrate 22 may be disposed on a waferland 84 which may receive an alternating voltage at a radio frequency in the megahertz range (e.g. 13.66 MHz) from a voltage source 83. The system as described in this paragraph is known in the prior art.

An alternating voltage in the middle frequency range of approximately 20 KHz to approximately 80 KHz (preferably approximately 40 KHz) is provided by a source 86. Alternate half cycles of the alternating voltage from the source 86 are applied to the target 32 through an inductance 88 and the other half cycles of the alternating voltage from the source 86 are applied to the target 34 through an inductance 89. The inductances 88 and 89 define a low pass filter and isolate the alternating voltage source 86 from a source 92 which provides an alternating voltage at a radio frequency (e.g. 13.66 MHz). The voltage sources 83 and 92 may be combined into a single voltage source operative at a suitable radio frequency such as approximately 1366 MHz.

Capacitors 96 and 97 are respectively connected between the alternating voltage source 92 and the inner target 34 and between the voltage source and the outer target 32. An asymmetric circuit indicated in block form at 98 has terminals 98a and 98b at its opposite ends. The terminals 98a and 98b are respectively connected to inductances 100 and 102 and capacitor 140 which define a low pass filter and protect the asymmetric circuit from RF power provided by the source 92. Connections are respectively made from the inductances 100 and 102 to the targets 32 and 34.

The alternating voltage at the middle frequency (e.g. 40 KHz) is applied from the source 86 to the targets 32 and 34. The voltage can be applied to the targets 32 and 34 because the impedances of the inductances 88 and 89 are relatively low at the middle frequency. At the same time, the inductances 88 and 89 have a high impedance at the radio frequencies (e.g. 13.66 MHz). This prevents the voltage from the source 92 from affecting the operation of the alternating voltage source 86. It also assures that the alternating voltage from the source 92 will be introduced to the targets 32 and 34.

The capacitors 96 and 97 also split the radio frequency power applied to the targets 32 and 34 from the source 92. The ratio of the split is dependent upon the relative values of the capacitors 96 and 97. At the radio frequency (e.g. 13.66 MHz), the capacitors 96 and 97 have a low impedance. This allows the voltage from the source 92 to be introduced to the targets 32 and 34. At the middle frequencies, the capacitors 96 and 97 have a high impedance. This prevents the voltage from the source 86 from being introduced to the source 92 and the voltage from the source 92 from being introduced to the source 86.

The source 86 produces an alternating voltage indicated at 100 in FIG. 11. The alternating voltage from the source 92 modulates the voltage 100 produced by the source 86. This modulation is indicated at 102 in FIG. 11. As will be seen, the amplitude of the voltage from the source 86 is considerably greater than the amplitude of the voltage from the source 92. If only the voltage source 86 were provided as in the prior art, a positive triggering voltage 70 would be produced at the target 32 in alternate half cycles of the alternating voltages as indicated in FIG. 11. Similarly, a positive triggering voltage 76 would be produced at the target 34 in the other half cycles of the alternating voltage as indicated in FIG. 11. This is how the systems of the prior art operate.

By modulating the alternating voltage at the middle frequency (40 KHz) with the alternating voltage at the radio frequency (e.g. 13.66 MHz), a triggering signal is produced only in the first half cycle of the alternating voltage from the source 86. This is indicated at 108 in FIG. 12. No triggering signal corresponding to the triggering signal 108 is produced in any of the subsequent alternate half cycles. This assures that a smooth deposition will be provided from the target 32 on the substrate 22. In like manner, only a single triggering signal corresponding to the triggering signal 108 will be produced on the target 34 in the first one of the half cycles when a positive voltage is introduced to the target. No triggering signals will thereafter be produced on the target 34. This will eliminate any deposition on the substrate 22 of foreign particles produced in the plasma discharge in each half cycle of the alternating voltage from the source (corresponding to the source 86) in the prior art.

Even when the alternating voltage from the source 86 is modulated by the alternating voltage from the source 92, the deposition rate of the material from the target in the central region of the substrate is greater than the deposition rate of the material from the target 32 at the periphery of the substrate. This is what happens in the prior art. In each instance, a substrate 22 of inferior quality is produced.

The system 72 shown in FIG. 2 compensates for the differences in the thickness of the substrate 22 at the central and peripheral portions of the substrate. This is accomplished by providing the asymmetric circuit 98. The asymmetric circuit 98 has terminals 98a and 98b at its opposite ends. The asymmetric circuit 98 provides more power to the target 32 then to the target 34 to equalize the deposition rates produced in the substrate by the targets. This may be seen from FIG. 8 where an alternating voltage 110 is introduced to the target 34 and an alternating voltage 112 is introduced to the target 32. The alternating voltages 110 and 112 are positioned relative to an axial line 114. Ordinarily, as in the prior art, the alternating voltages are positioned relative to an axial line 115 intermediate between the peaks of the alternating voltages 110 and 112.

Figure 8:
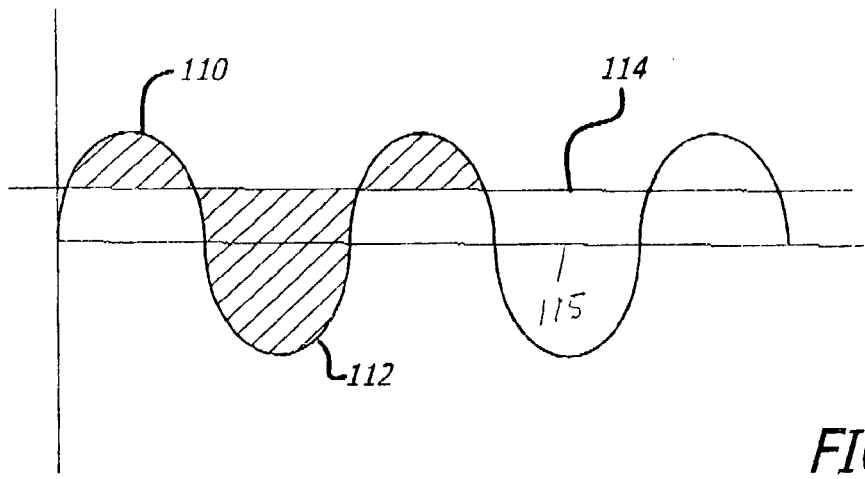
FIG. 8 is a curve schematically showing the asymmetric power generated in successive cycles of an alternating voltage in the asymmetric power generators shown in FIGS. 4–7 and also showing a symmetric power generated in the prior art.

As will be seen in FIG. 8, the amplitude of the alternating voltage 112 introduced to the target 32 is greater than the amplitude of the voltage 110 introduced to the target 34 when the axial line is at 114 in FIG. 8. This increases the rate of the deposition provided from the target 32 on the substrate 22 and decreases the rate of the deposition provided from the target 34 on the substrate. The relative amplitudes of the voltages applied to the targets 32 and 34 can be adjusted so that the rates of the deposition at all of the positions on the substrate are substantially uniform. As a result, the thickness of the deposition on the substrate 22 is substantially uniform at all of the positions on the substrate.

FIG. 3 shows two additional diodes 202 and 203 each connected from an individual one of the terminals of the asymmetric circuit 98 to the anode 40 and other shields (including shields 78 and 80) inside the process chamber. As described above, the magnetic field inhibits "cold" electrons from leaving the plasma 160 and 162 in FIG. 13. As a result, these electrons travel in the prior art to the substrate 22 and create heat and produce a bombardment of the substrate by attracting ions which travel to the substrate. This heat and bombardment may damage devices (chips) on the substrate in the systems of the prior art.

By including the diodes 202 and 203 in the system of this invention, the "cold" electrons leave the plasma 160 and 162 much easier than in the prior art to travel to the shields (e.g., 78 and 80). For example, assume that a negative half cycle of voltage is applied to the target 32. In this case the diode 202 has a high impedance. The opposite terminal of the asymmetric circuit 98 has a positive potential at this time. This causes the diode 203 to have a low impedance and positive voltage from the asymmetric circuit 98 to be applied to the target 34, the anode 40 and the shields 78 and 80. To leave the plasma 162, "cold" electrons have to pass through the target 34 and through the shields 78 and 80 and the anode 40. The most preferable pass is through the shields 80 and 78 and the anode 40 because these components of the process chamber have a low resistance to electrons while the target 34 has on its surface a magnetic field which inhibits electrons from reaching the target 34. As a result, the "cold" electrons leave the plasma discharge 162 and pass to the anode 40 and the shield (e.g. 78 and 80) and don't dissipate their energy as heat on the substrate 22 or other parts of the process chamber. When a negative voltage is applied to the target 34, the circuit works the same way as described in the previous paragraph, but the positive voltage is applied now through the diode 202. At the same time, the diode 203 has a high impedance.

Preventing the "cold" electrons from passing to the substrate 22 reduces the substrate temperature and diminishes the compressive stress in the oxide and nitride films which typically have a tendency to produce a high compressive stress of several hundred MPa.

FIG. 5 shows on a simplified basis a preferred embodiment, generally indicated at 120, of the asymmetric generator 98 shown in FIG. 3. The embodiment 120 includes the terminals 98a and 98b at the opposite ends of the asymmetric circuit 98. The embodiment 120 also includes on a schematic basis the alternating voltage source 86 for introducing the alternating voltage at the middle frequency (e.g., 40 KHz) to the asymmetric circuit 98. The capacitor 122 and the diode 124 are in parallel with each other and in series with the voltage source 86 between the terminals 98a and 98b.

In the forward direction of the diode 124, the diode has a low impedance. In alternate half cycles, current flows from the voltage source 86 through the diode 124 to the target 32. This produces a large signal indicated at 112 in FIG. 8. In other half cycles of the alternating voltage from the source 86, the diode 124 has a high impedance and blocks any flow of current. However, current flows through the capacitor 122 but the flow is limited by an amount depending upon the size of the capacitor. This causes the alternating voltage signal 110 in FIG. 8 to be produced.

The capacitor 122 is chosen so that the amplitude of the voltage applied to the target 34 is as indicated at 110 in FIG. 8. The difference between the peak amplitudes of the alternating voltages 110 and 112 in FIG. 8 is dependent upon the size of the capacitor 122 and upon the frequency of the alternating voltage provided by the source 86. This difference is chosen to compensate for the difference in the thickness of the depositions provided by the targets 32 and 34 on the substrate 22.

Figure 6:
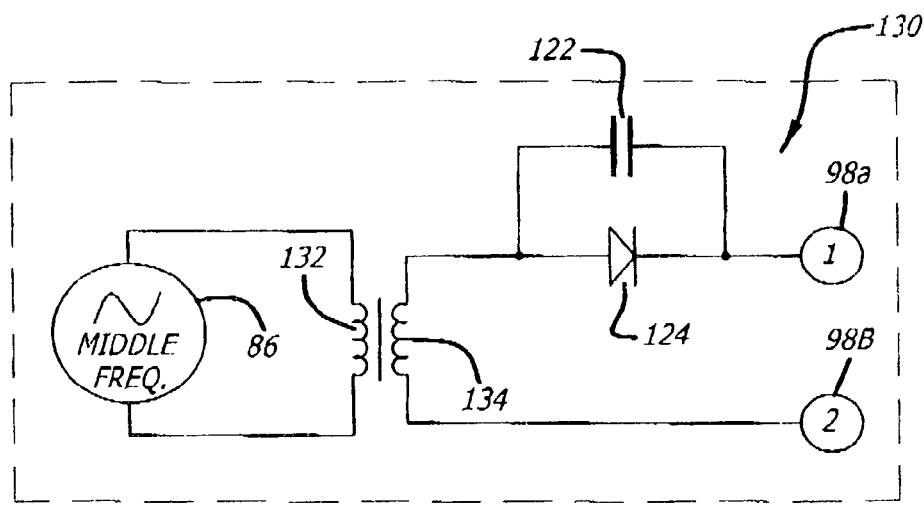
FIG. 6 is an electrical circuit diagram of another preferred embodiment of the asymmetric power generator shown in FIG. 4.

FIG. 6 shows on a schematic basis another preferred embodiment, generally indicated at 130, of the asymmetric circuit 98 in FIGS. 2 and 3. The embodiment 130 includes the diode 124 and the capacitor 122 also shown in FIG. 5. The embodiment 130 also includes (a) a primary winding 132 connected across the voltage source 86 and (b) a secondary winding 134 magnetically coupled to the primary winding 132. One terminal of the secondary winding 134 is connected to the terminal 98b and the other terminal of the winding is connected to the capacitor 122 and the diode 124.

Current flows in the primary winding 132 in every half cycle of the alternating voltages from the source 86. In the alternate half cycles when the target 32 provides a deposition on the substrate 22, current flows through the low impedance path provided by the diode 124. This causes all of the energy accumulated on the magnetic structure between the windings 132 and 134 to be dispensed through the diode 124. However, in the other half cycles of the alternating voltage from the source 86, the diode 124 has a high impedance and only a portion of the energy provided by the primary winding is dispensed by the flow of current through the capacitor 122. This causes some of the energy to remain in the magnet structure between the windings. This energy is dispensed by the flow of current through the diode 124 in the next half cycle of the alternating voltage. This causes the peak amplitude of the voltage 112 in FIG. 8 to increase relative to the peak amplitude of the voltage 110.

Figure 7:
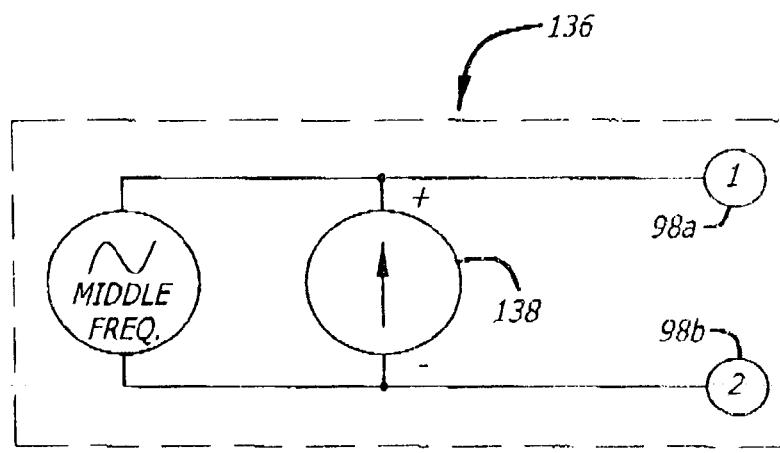
FIG. 7 is an electrical circuit diagram of a further preferred embodiment of the asymmetric power generator shown in FIG. 4.

FIG. 7 shows on a schematic basis another preferred embodiment, generally indicated at 136, of the asymmetric circuit 98 in FIGS. 2 and 3. In this embodiment, a direct voltage from a source 138 is applied between the terminals 98a and 98b. The direct voltage is applied in a direction to increase the peak amplitude of the voltage 112 in FIG. 8 and to decrease the peak amplitude of the voltage 110. The amount of the increase in the peak amplitude of the voltage 112 and the decrease in the peak amplitude of the voltage 110 is dependent upon the magnitude of the direct voltage provided by the voltage source 138.

FIG. 4 shows a portion of the circuitry also shown in FIGS. 2 and 3. The portion of the circuitry shown in FIG. 4 includes the asymmetric circuit 98, the targets 32 and 34 and the inductances 100 and 102. This portion of the circuitry shows that the inductances 100 and 102 act as filters to prevent the radio frequency energy at approximately 13.66 MHz from the alternating voltage source 92 from passing through the asymmetric circuit 98.

As previously indicated, dielectric material accumulates on the surfaces of the targets 32 and 34 and other components in the deposition apparatus 76. The dielectric layer accumulates when molecules of gases such as oxygen, nitrogen and methane react with molecules or atoms sputtered from the surfaces of the targets 32 and 34. The sputtered atoms or molecules may illustratively be silicon, aluminum or tantalum and they react illustratively with the oxygen, nitrogen and methane molecules to form illustratively silicon dioxide, aluminum oxide and a tantalum compound including oxygen and nitrogen. These compounds become deposited on the surfaces of the targets 32 and 34 and prevent atoms or molecules of the material forming the targets 32 and 34 from being sputtered from the targets.

Assume that a layer of one of the dielectric materials specified in the previous paragraph has been deposited on the target 32. Assume also that the target 32 is receiving a negative voltage from the voltage source 86. At this time plasma 160 formed from the positive ions has accumulated in the cavity 42 adjacent the target 32. The plasma 160 is indicated as a cloud in FIG. 13. The plasma 160 is formed adjacent the negative target 32 because the plasma is formed from positive ions which move relatively slowly so that they accumulate adjacent the target.

The plasma 160 formed by the positive ions adjacent the target 32 is relatively strong and the layer of the dielectric material deposited on the surface of the target 32 is relatively thin. As a result, the electrical field accelerates ions from the plasma 160 and produces a bombardment of the target 32. The bombardment causes the dielectric material on the surface of the target 34 to be removed from the target. In this way, the surfaces of the targets 32 and 34 are alternately cleared of dielectric material in the successive half cycles of the alternating voltage from the source 86.

During the half cycle in which the dielectric material is removed from the surface of the target 32 as described above, a layer of the dielectric material is forming on the target 34. In the next half cycle of the alternating voltage from the source 86, the dielectric layer is removed from the surface of the target 34 by the action of the plasma 162 in the manner described above. In this way, the surfaces of the targets 32 and 34 are alternately cleaned of dielectric material in the successive half cycles of the alternating voltage from the source 86.

Although this invention has been disclosed and illustrated with reference to particular embodiments, the principles involved are susceptible for use in numerous other embodiments which will be apparent to persons of ordinary skill in the art. The invention is, therefore, to be limited only as indicated by the scope of the appended claims.

What is claimed is:

1. In combination for use with a substrate,
a first target,
a second target displaced from the first target and disposed in a coaxial relationship with the first target,
first electrical circuitry operatively coupled to the first and second targets for obtaining a deposition of material from the targets on the substrate, and
second electrical circuitry operatively associated with the first electrical circuitry for preventing dielectric material from being deposited on the surfaces of the targets during the deposition of material from the targets on the substrate.

2. In a combination as set forth in claim 1 wherein
the first electrical circuitry provides an alternating voltage to the targets at a first frequency and wherein
the second electrical circuitry adjusts for the alternating voltage applied to the targets to adjust the relative amounts of material deposited from the first and second targets on the substrate and provide a substantially uniform deposition on the surface of the substrate.

3. In a combination as set forth in claim 1 wherein
the first electrical circuitry provides a symmetrical alternating voltage for application to the first and second targets and wherein
the second electrical circuitry is operatively associated with the first electrical circuitry to provide an asymmetry to the alternating voltage applied to the first and second targets, this asymmetry being in a direction to provide the substantially uniform deposition on the surface of the substrate.

4. In a combination as set forth in claim 2 wherein
the first electrical circuitry provides a symmetrical alternating voltage for application to the first and second targets and wherein
the second electrical circuitry provides for a greater amplitude of the alternating voltage to one of the targets than to the other one of the targets to compensate for differences in the rate of the deposition on the substrate from the targets,
from the first and second targets on the substrate and provide a substantially uniform deposition on the surface of the substrate.

5. In a combination as set forth in claim 4 wherein
the first electrical circuitry provides a symmetrical alternating voltage for application to the first and second targets and wherein
the second electrical circuitry is operatively associated with the first electrical circuitry to provide an asymmetry to the alternating
voltage applied to the first and second targets, this asymmetry being in a direction to
provide the substantially uniform deposition on the surface of the substrate.

6. A system for depositing material on a substrate, including,
a first target, a second target disposed in a coaxial relationship with the first electrode, first circuitry for applying a first alternating voltage to the first and second targets, and second circuitry for modulating the first alternating voltage with a second alternating voltage at a radio frequency to provide for a triggering of the targets only in an initial cycle of operation for each individual one of the targets, the second electrical circuitry including reactive components having individual values for controlling the rate at which material is deposited from each of the targets on the substrate to provide for the cumulative deposition of the material from the targets at the different positions on the substrate at a substantially constant rate.

7. A system as set forth in claim 6 wherein
the reactive components constitute capacitors.

8. A system as set forth in claim 7 wherein
the reactive components constitute a pair of capacitors one connected to the first target to pass the alternating voltage at the radio frequency in alternate half cycles to the first target and the other connected to the second target to pass the alternating voltage at the radio frequency to the second target, each of the capacitors having a different value from the other capacitor.

9. A system as set forth in claim 8 wherein
the capacitors have individual values to compensate for differences in the rate at which material from the targets would be deposited on the substrate if the capacitors had the same values.

10. A system as set forth in claim 6 wherein
the first circuitry includes a source of direct voltage applied to the targets.

11. A system as set forth in claim 9 wherein
the first circuitry includes a source of direct voltage applied to the targets.

12. A system as set forth in claim 7 wherein
the reactive components constitute a pair of capacitors one connected to the first target to pass the alternating voltage at the radio frequency in alternate half cycles to the first target and the other connected to the second target to pass the alternating voltage at the radio frequency to the second target, each of the capacitors having a different value from the other capacitor and wherein
the capacitors have individual values to compensate for differences in the rate at which the material from the targets would be deposited on the substrate if the capacitors had the same values and wherein the first circuitry includes a source of direct voltage applied to the targets.

13. In combination for depositing material on a substrate,
a first target,
a second target disposed in a spaced frusto-conical relationship with the first target,
a first circuit for applying an alternating voltage at a particular frequency in the middle frequency range between the first and second targets,
a second circuit for modulating the signals at the particular frequency with alternating voltage signals at a radio frequency, and
electrical circuitry for adjusting the application of the signals at the particular frequency to the first and second targets to produce a deposition of material from the targets on the surface of the substrate in a substantial uniform thickness throughout the surface of the substrate.

14. In a combination as set forth in claim 13 wherein
the first and second targets are disposed relative to the substrate to provide a greater rate of deposition of material on the substrate from the first target than from the second target and wherein
the alternating voltage at the particular frequency is applied to the second target with a greater intensity than to the first target to compensate for the differences in the rate of deposition of material on the substrate from the first and second targets.

15. In combination as set forth in claim 13 wherein
the particular frequency is in a range of approximately twenty kilohertz (20 KHz) to approximately eighty kilohertz (80 KHz).

16. In a combination as set forth in claim 13 wherein
the first circuit includes a diode connected to pass the alternating voltage at the particular frequency to the second target in the positive half cycles of the alternating voltage and to block the passage of the alternating voltage at the particular frequency to the first target in the negative half cycle of the alternating voltage and wherein
the first circuit additionally includes a capacitor connected across the diode to pass the alternating voltage at the particular frequency to the second target in the negative half cycle of the alternating voltage.

17. In combination as set forth in claim 14 wherein
a direct voltage is connected across the first circuit in a direction to enhance the rate of the deposition of material from the first target on the substrate in the positive half cycles of the alternating voltage at the particular frequency and to detract from the rate of the deposition of material from the second target on the substrate in the negative half cycles of the alternating voltage at the particular frequency.

18. In a combination as set forth in claim 13 wherein
the first circuitry includes a transformer connected in the circuit to store energy in the negative half cycles of the alternating voltage at the particular frequency and to release this stored energy to the first target in the positive half cycles of the alternating voltage at the particular frequency.

19. In a combination for use with a substrate,
first and second targets, each, disposed in a coaxial relationship with each other and disposed relative to the substrate for depositing material on the substrate,
a source of an alternating voltage connected to the first and second targets for respectively introducing the alternating voltage of opposite polarities to the first and second targets, and
electrical circuitry connected to the source of the alternating voltage and the first and second targets for introducing a limited amplitude of the voltage to one of the targets in alternate half cycles of the alternating voltage relative to the amplitude of the alternating voltage introduced to the other one of the targets in the other ones of the half cycles to compensate for an increased rate of the deposition of material on the substrate from the one of targets relative to the rate of the deposition of material on the substrate from the other one of the targets.

20. In a combination as set forth in claim 19 wherein
the electrical circuitry includes a diode and a capacitor connected across the diode to limit the amplitude of the voltage introduced to the one of the targets in the alternate half cycles of the alternating voltage relative to the amplitude of the alternating voltage introduced to the other one of the targets in the other one of the half cycles and wherein a transformer is provided with primary and secondary windings and wherein the primary winding is connected to the source of the alternating voltage and the secondary winding is included in the electrical circuitry to cooperate with the diodes and the capacitor in limiting the amplitude of the voltage introduced to the one of the targets in the alternate half cycles of the alternating voltages relative to the amplitude of the alternating voltage introduced to the other one of the targets in the other ones of the half cycles.

21. In a combination as set forth in claim 19 wherein
the electrical circuitry includes a source of direct voltage connected across the source of alternating voltage and connected to the first and second targets to limit the amplitude of the voltage introduced to the one of the targets in the alternate half cycles in to alternate half cycles of the alternating voltage relative to the amplitude of the alternating voltage introduced to the other one of the targets in the other half cycles.

22. In a combination as set forth in claim 19 wherein the electrical circuitry includes one of the following:
(a) a diode and a capacitor connected across the diode to limit the amplitude of the voltage introduced to the one of the targets in the alternate half cycles of the alternating voltage relative to the amplitude of the alternating voltage introduced to the other one of the targets in the other half cycles of the alternating voltage, and
(b) a transformer provided with primary and secondary windings wherein the primary winding is connected to the source of the alternating voltage and the secondary winding is included in the electrical circuitry to cooperate with the diodes and the capacitor in limiting the amplitude of the voltage introduced to the one of the targets in the alternate half cycles of the alternating voltages relative to the amplitude of the alternating voltage introduced to the other one of the targets in the other half cycles; and
(c) a source of direct voltage connected across the source of alternating voltage and connected to the first and second targets to limit the amplitude of the voltage introduced to the one of the targets in the alternate half cycles of the alternating voltage relative to the amplitude of the alternating voltage introduced to the other one of the targets in the other half cycles of the alternating voltage.

23. In a combination for use with a substrate,
a first target made from a particular material,
a second target made from a particular material and disposed in a co-axial relationship with the first target,
a source of an alternating voltage connected to the first and second targets to provide at each instant voltages of opposite polarities on the first and second targets for obtaining the depositions of material from the first and second targets on the substrate, and
electrical circuitry associated with the targets and the source of the alternating voltage for adjusting the relative characteristics of the voltages of opposite polarities from the source to provide a deposition of a substantially uniform thickness of material from the targets on the surface of the substrate, wherein
the first and second targets normally produce on the substrate depositions of different thicknesses and wherein the characteristics of the voltage applied to the first target are adjusted relative to the characteristics of the voltage applied to the second target to eliminate any differences in the thicknesses produced in the substrate by the depositions of material from the first and second targets on the substrate, wherein
the electrical circuitry includes a first member having characteristics of passing current at a low impedance in a first direction and of preventing the passage of current of a particular magnitude in a second direction opposite to the first direction and includes a second member for passing a current of a controlled magnitude, less than the particular magnitude, in the second direction, to compensate for differences between the depositions provided on the substrate from the first and second targets upon a flow of currents of substantially equal magnitudes in the first and second opposite directions.

24. In a combination as set forth in claim 23 wherein
the first member is a diode and the second member is a capacitor.

25. In a combination as set forth in claim 23 wherein
the electrical circuitry includes a transformer having first and second magnetically coupled windings and wherein the first winding is connected to the source of the alternating voltage and the second winding is coupled to the first and second members.

26. In combination for depositing material on a substrate,
a first target,
a second target displaced from the first target and disposed in a frusto-conical relationship with the first target, and
electrical circuitry associated with the first and second targets for applying an alternating voltage between the first and second targets in an asymmetric relationship to provide a uniform rate of deposition on the substrate of material from the first and second targets, wherein
second electrical circuitry is provided in cooperation with the first electrical circuitry for triggering the targets only once at the beginning of the deposition of the material on the substrate and wherein the second electrical circuitry in cooperation with the first electrical circuitry maintains the deposition of material on the substrate in the successive half cycles without any further triggering.

27. In a combination as set forth in claim 26 wherein
the disparate rates of deposition are produced by disparate rates of depositions of material on the substrate from the first and second targets and wherein the asymmetric characteristics of the alternating voltage cause comparable rates of depositions of the material to be provided from the first and second targets on the substrate.

28. In a method of providing a deposition on a substrate, the steps of:
disposing a pair of targets in an axially coordinate relationship to deposit material from the surfaces of the targets on the substrate,
applying an alternating voltage between the targets to produce a positive voltage on one of the targets and a negative voltage on the other one of the targets in alternate half cycles, and to produce a negative voltage on the one of the targets, and a positive voltage on the other one of the targets, in the other half cycles to generate plasma adjacent the negative one of the targets in each half cycle of the alternating voltage, and
using the plasma generated in each half cycle of the alternating voltage to remove dielectric material from the adjacent one of the targets receiving the negative voltage in the half cycle of the alternating voltage wherein the alternating voltage is provided with a middle frequency and is modulated with a radio frequency voltage.

29. In a method as set forth in claim 28 wherein
the alternating voltage is provided with a middle frequency in the range of approximately 20 kilohertz (20 kHz) to approximately 80 kilohertz (80 kHz) and is modulated with a radio frequency voltage in the order of 13.66 megahertz.

30. In a method of providing a deposition on a substrate, the steps of,
disposing a pair of targets in an axially coordinate relationship to deposit material from the surfaces of the targets on the substrate,
providing an alternating voltage having asymmetric characteristics to compensate for differences in the rate of deposition of material at different positions on the substrate from the targets, and
introducing the asymmetric alternating voltage to the targets to compensate, in the rates of depositions of material from the targets on the substrate, for the differences in the rates of deposition of material at different positions on the substrate surface from the first and second targets.

31. In a method as set forth in claim 30 wherein
the asymmetry in the alternating voltage causes the alternating voltage applied to one of the targets in alternate half cycles of the alternating voltage to be different from the alternating voltage applied to the other one of the targets in the other half cycles of the alternating voltage to compensate for the differences in the rates of deposition of material from each of the targets at the different positions on the substrate.

32. In a method as set forth in claim 31 wherein
the alternating voltage has a first frequency and an alternating voltage having a second frequency higher than the first frequency modulates the alternating voltage at the first frequency to provide for a triggering of each of the targets in only a first one of the cycles of the alternating voltage at the first frequency.

33. In a method as set forth in claim 30 wherein
the alternating voltage having the first frequency has a middle frequency in the range of approximately 20 kilohertz (20 KHz) to approximately 80 kilohertz (20 KHz) and the alternating voltage having the second frequency provides the frequency in the radio frequency range.

34. In a method as set forth in claim 30 wherein
the asymmetric alternating voltage has a higher amplitude in alternate half cycles than in the other half cycles and wherein
the targets are disposed in a frusto-conical relationship and wherein
material deposited on the substrate from one of the targets has a higher density than material deposited on the substrate from the other one of the targets when an alternating voltage having equal amplitudes is applied to the targets in successive half cycles and wherein
the asymmetric alternating voltage with the lower amplitude is applied to the target depositing material on the substrate at the higher rate.

35. In a method as set forth in claim 30 wherein
an anode is disposed relative to the targets to define a cavity with the targets and wherein an electrical field is produced in the cavity between the anode and targets in a first direction and wherein
a magnetic field is provided in the cavity in a second direction substantially perpendicular to the first direction and wherein
molecules of an inert gas are introduced into the cavity.

36. In a method as set forth in claim 30 wherein
the asymmetry in the alternating voltage causes the alternating voltage applied to one of the targets in alternate half cycles of the alternating voltage to be different from the alternating voltage applied to the other one of the targets in the other half cycles of the alternating voltage to compensate for differences in the rate of deposition of material from each of the targets at different positions on the substrate and wherein
the alternating voltage has a first frequency and an alternating voltage having a second frequency higher than the first frequency modulates the alternating, voltage at the first frequency to provide for a triggering of each of the targets in only a first one of the cycles of the alternating voltage applied to the target at the first frequency.

37. In a method of providing a deposition on a substrate, the steps of:
disposing a pair of targets in an axially coordinate relationship to deposit material from the surfaces of the targets on the substrate,
applying between the targets a first alternating voltage having a first frequency to obtain a deposition of material from one of the targets on the substrate in alternate half cycles of the alternating voltage and to obtain a deposition of material from the other one of the targets on the substrate in the other half cycles of the alternating voltage, and
modulating the first alternating voltage with a second alternating voltage having a second frequency higher than the first frequency to provide for a triggering of each of the targets in only a first one of the cycles of the alternating voltage applied to the target at the first frequency.

38. In a method as set forth in claim 37 wherein
the first frequency is between approximately 20 kilohertz and 80 kilohertz and wherein
the second frequency is a radio frequency in the megahertz range.

39. In a method as set forth in claim 37 wherein
an anode is disposed relative to the targets to define a cavity with the targets and wherein
an electrical field is produced in the cavity between the anode and the target in a first direction and wherein
a magnetic field is produced in the cavity in a second direction substantially perpendicular to the first direction and wherein
molecules of an inert gas are introduced into the cavity.

40. In a method as set forth in claim 37 wherein
the amplitude of the first alternating voltage in alternate half cycles is greater than the amplitude of the first alternating voltage in the other half cycles to compensate for differences in the rate of deposition of material from one of the targets on the substrate relative to the rate of deposition of material from the other one of the targets on the substrate.

41. In a method as set forth in claim 40 wherein
the differences in the amplitude of the second alternating voltage in alternate half cycles and the amplitude of the second alternating voltage in the other half cycles are provided bypassing the second alternating voltage in the alternate half cycles through a capacitor of a first value and by passing the second alternating voltage in the other half cycles through a capacitor of a second value different from the first value.

42. In a method as set forth in claim 39 wherein
the amplitude of the first alternating voltage in alternate half cycles is greater than the amplitude of the first alternating voltage in the other half cycles to compensate for differences in the rate of deposition of material from one of the targets on the substrate relative to the rate of deposition of material from the other one of the targets on the substrate and wherein
the differences in the amplitude of the first alternating voltage in alternate half cycles and the amplitude of the first alternating voltage in the other half cycles are provided by passing the second alternating voltage in the alternate half cycles through a capacitor of a first value and by passing the second alternating voltage in the other half cycles through a capacitor of a second value different from the first value.

43. In a method as set forth in claim 42 wherein
the first frequency is between approximately 20 kilohertz (20 KHz) and approximately 80 kilohertz (80 KHz) and the second frequency is in the megahertz range.

44. In a combination for use with a substrate,
a first target,
a second target displaced from the first target and disposed in a coaxial relationship with the first target,
first electrical circuitry including a source of alternating voltage operatively coupled to the first and second targets for obtaining a deposition of material from the targets on the substrate,
the first target providing plasma adjacent to the second target in first half cycles of the alternating voltage and the second target providing plasma adjacent to the first target in the other half cycles of the alternating voltage, the plasma having a negative potential,
components other than the substrate bias to receive the plasma, and
second electrical circuitry operatively associated with the targets for directing plasma to the components other than the substrate in the successive half cycles of the alternating voltage,
third circuitry for providing for a greatest amplitude of the alternating voltage to one of the targets than to the other one of the targets to compensate for differences in the rate of the deposition on the substrate from the targets.

45. In a combination for use with a substrate,
a first target,
a second target displaced from the first target and disposed in a coaxial relationship with the first target,
first electrical circuitry including a source of alternating voltage operatively coupled to the first and second targets for obtaining a deposition of material from the targets on the substrate,
the first target providing plasma adjacent to the second target in first half cycles of the alternating voltage and the second target providing plasma adjacent to the first target in the other half cycles of the alternating voltage, the plasma having a negative potential,
components other than the substrate biased to receive the plasma, and
second electrical circuitry operatively associated with the targets for directing plasma to the components other than the substrate in the successive half cycles of the alternating voltage,
third circuitry operatively coupled to the first and second targets for preventing dielectric material from being deposited on the surface of the targets during the deposition of material from the targets on the substrate.

46. In a combination for use with a substrate,
a first target,
a second target displaced from the first target and disposed in a coaxial relationship with the first target,
first electrical circuitry including a source of alternating voltage operatively coupled to the first and second targets for obtaining a deposition of material from the targets on the substrate,
the first target providing plasma adjacent to the second target in first half cycles of the alternating voltage and the second target providing plasma adjacent to the first target in the other half cycles of the alternating voltage, the plasma having a negative potential,
components other than the substrate biased to receive the plasma, and
second electrical circuitry operatively associated with the targets for directing plasma to the components other tan the substrate in the successive half cycles of the alternating voltage,
the alternating voltage constituting a first alternating voltage,
third circuitry for modulating the first alternating voltage with a second alternating voltage at a radio frequency to provide for a triggering of the targets only in an initial cycle of operation for each individual one of the targets.

47. In a combination for use with a substrate,
a first target,
a second target displaced from the first tar&et and disposed in a coaxial relationship with the first target,
first electrical circuitry including a source of alternating voltage operatively coupled to the first and second targets for obtaining a deposition of material from the targets on the substrate,
the first target providing plasma adjacent to the second target in first half cycles of the alternating voltage and the second target providing plasma adjacent to the first target in the other half cycles of the alternating voltage, the plasma having a negative potential,
components other than the substrate biased to receive the plasma, and
second electrical circuitry operatively associated with the targets for directing plasma to the components other than the substrate in the successive half cycles of the alternating voltage,
third electrical circuitry including reactive components having individual values for controlling the rate at which material is deposited from each of the targets on the substrate to provide for the cumulative deposition of the material from the targets at the different positions on the substrate at a substantially constant rate.

48. In a combination as set forth in claim 44,
third circuitry operatively coupled to the first and second targets for preventing dielectric material from being deposited on the surface of the targets during the deposition of material from the targets on the substrate.

49. In a combination as set forth in claim 44,
the alternating voltage constituting a first alternating voltage,
third circuitry for modulating the first alternating voltage with a second alternating voltage at a radio frequency to provide for a triggering of the targets only in an initial cycle of operation for each individual one of the targets.

50. In a combination as set forth in claim 45, the alternating voltage constituting a first alternating voltage, third circuitry for modulating the first alternating voltage with a second alternating voltage at a radio frequency to provide for a triggering of the targets only in an initial cycle of operation for each individual one of the targets.

51. In a combination for use with a substrate, a first target, a second target disposed in a coaxial relationship with the first target, first circuitry for applying an alternating voltage to the first and second targets to provide a positive voltage to the first target in first alternate half cycles and to provide a positive voltage to the second target in the other alternate half cycles of the alternating voltage, second circuitry associated with the first circuitry for alternately providing a deposition of material from individual ones of the first and second targets on the substrate in successive half cycles of the alternating voltage and for alternately providing a plasma of charged particles adjacent individual ones of the targets in successive half cycles of the alternating voltage, and third circuitry for preventing the charged particles in the plasma adjacent each of the targets from reaching the substrate.

52. In a combination as set forth in claim 51, components disposed relative to the plasma adjacent the targets and biased to receive the charged particles adjacent the targets.

53. In a combination as set forth in claim 51, third circuitry for modulating the alternating voltage to provide for a triggering of the targets only in an initial cycle of operation for each individual one of the targets.

54. In a combination as set forth in claim 51, the third circuitry including reactive components having individual values for controlling the rate at which material is deposited from each of the targets on the substrate to provide for the cumulative deposition of the material from the targets at the different positions on the substrate at a substantially constant rate.

55. In a combination as set forth in claim 52, third circuitry for modulating the alternating voltage to provide for a triggering of the targets only in an initial cycle of operation for each individual one of the targets, the third circuitry including reactive components baying individual values for controlling the rate at which material is deposited from each of the targets on the substrate to provide for the cumulative deposition of the material from the targets at the different positions on the substrate at a substantially constant rate.

56. In a combination as set forth in claim 51, an asymmetric circuit associated with the first and second targets for adjusting the rates at which materials are deposited from the first and second targets on the substrate to provide a deposition with a substantially uniform thickness on the substrate.

57. In a combination as set forth in claim 52, third circuitry for modulating the alternating voltage to provide for a triggering of the targets only in an initial cycle of operation for each individual one of the targets, and an asymmetric circuit associated with the first and second targets for adjusting the rates at which materials are deposited from the first and second targets on the substrate to provide a deposition with a substantially uniform thickness on the substrate.

* * * * *